US010450669B2

United States Patent
Yu et al.

(10) Patent No.: US 10,450,669 B2
(45) Date of Patent: Oct. 22, 2019

(54) CONTAINER FOR SILICON INGOT FABRICATION AND MANUFACTURING METHOD THEREOF, AND METHOD FOR MANUFACTURING CRYSTALLINE SILICON INGOT

(71) Applicant: AUO Crystal Corporation, Taichung (TW)

(72) Inventors: Chang-Ho Yu, Kaohsiung (TW); Yen-Ming Chen, Taichung (TW)

(73) Assignee: AUO Crystal Corporation, Taichung (TW)

( * ) Notice: Subject to any disclaimer, the term of this patent is extended or adjusted under 35 U.S.C. 154(b) by 0 days.

(21) Appl. No.: 15/633,777

(22) Filed: Jun. 27, 2017

(65) Prior Publication Data
US 2018/0030613 A1 Feb. 1, 2018

Related U.S. Application Data

(60) Provisional application No. 62/368,178, filed on Jul. 29, 2016.

(51) Int. Cl.
*C30B 11/00* (2006.01)
*C30B 29/06* (2006.01)

(52) U.S. Cl.
CPC .......... *C30B 11/002* (2013.01); *C30B 11/003* (2013.01); *C30B 29/06* (2013.01)

(58) Field of Classification Search
CPC combination set(s) only.
See application file for complete search history.

(56) References Cited

U.S. PATENT DOCUMENTS 4,099,924 A   7/1978  Berkman et al.
9,758,901 B2  9/2017  Sudo et al.
(Continued)

FOREIGN PATENT DOCUMENTS

CN   87206316   12/1987
CN   1946881    4/2007
(Continued)

OTHER PUBLICATIONS

Jones et al., "Identification of the dominant nitrogen defect in silicon," Physical Review Letters, Mar. 12, 1994, pp. 1882-1886.
(Continued)

*Primary Examiner* — Erin F Bergner
(74) *Attorney, Agent, or Firm* — JCIPRNET

(57) ABSTRACT

A container for silicon ingot fabrication and a manufacturing method thereof are provided. The method includes the following steps. A base layer made of quartz is provided in a chamber. A powder solution layer is coated over an inner surface of the base layer. The powder solution layer includes silicon nitride or carbon. The base layer having the powder solution layer coated thereon is heated to a temperature of 1000° C. to 1700° C. while a reaction gas is supplied into the chamber for 2 hours to 8 hours to form a barrier layer over the inner surface of the base layer. The barrier layer includes silicon oxynitride represented by $Si_xN_yO_z$, $1 \leq x \leq 2$, $1 \leq y \leq 2$, and $0.1 \leq z \leq 1$. Moreover, a method for manufacturing a crystalline silicon ingot is also provided.

10 Claims, 8 Drawing Sheets

(56) References Cited

U.S. PATENT DOCUMENTS

2009/0277377 A1* 11/2009 Ohashi ............... C30B 11/002
                                                    117/206
2016/0108550 A1*  4/2016 Sudo ................. C30B 15/10
                                                    117/208

FOREIGN PATENT DOCUMENTS

| CN | 1315748 | 5/2007 |
| CN | 101576346 | 11/2009 |
| CN | 101696514 | 4/2010 |
| CN | 101942693 | 1/2011 |
| CN | 102127806 | 7/2011 |
| CN | 102373502 | 3/2012 |
| CN | 102589286 | 7/2012 |
| CN | 103102170 | 5/2013 |
| CN | 103269975 | 8/2013 |
| CN | 102260902 | 9/2013 |
| CN | 103339300 | 10/2013 |
| CN | 103803955 | 5/2014 |
| CN | 102409394 | 5/2015 |
| CN | 105264124 | 1/2016 |
| JP | H11278855 | 10/1999 |
| JP | 2009269792 | 11/2009 |
| TW | 201243115 | 11/2012 |
| WO | 2012090541 | 7/2012 |
| WO | 2014192163 | 12/2014 |

OTHER PUBLICATIONS

Sawada et al., "First principles calculation of interaction between nitrogen atoms and vacancies in silicon," Physical Review B, Jul. 15, 2000, pp. 1851-1858.

Kageshima et al., "Theoretical investigation of nitrogen-doping effect on vacancy aggregation processes in Si," Applied Physics Letters, Jun. 19, 2000, pp. 3718-3720.

"Office Action of China Counterpart Application", dated Jun. 6, 2019, p. 1-p. 9.

* cited by examiner

CONTAINER FOR SILICON INGOT FABRICATION AND MANUFACTURING METHOD THEREOF, AND METHOD FOR MANUFACTURING CRYSTALLINE SILICON INGOT

CROSS-REFERENCE TO RELATED APPLICATION

This application claims the priority benefit of U.S. provisional application Ser. No. 62/368,178, filed on Jul. 29, 2016. The entirety of the above-mentioned patent application is hereby incorporated by reference herein and made a part of this specification.

BACKGROUND OF THE INVENTION

1. Field of the Invention

The invention generally relates to a container and a manufacturing method thereof, in particular, to a container for silicon ingot fabrication.

2. Description of Related Art

A crystalline silicon wafer applied in a conventional crystalline silicon solar cell is typically formed by cutting a crystalline silicon ingot. The silicon ingot may be manufactured by heating a silicon material in a container to obtain molten silicon. Subsequently, the molten silicon is cooled and condensed to form the crystalline silicon ingot. However, during the heating process, molecules in the container may diffuse into the crystalline silicon ingot, causing the crystalline silicon ingot obtained to encompass high concentration of impurity. As such, the photoelectric conversion efficiency of the solar cell fabricated using the crystalline silicon ingot having high concentration of impurity would be jeopardized. Therefore, reducing impurity in the crystalline silicon ingot generated during the manufacturing process thereof has become an important issue for the researchers in the field.

SUMMARY OF THE INVENTION

The invention provides a container for silicon ingot fabrication and a manufacturing method thereof, which may effectively reduce the impurities in the silicon ingot. Moreover, a method for manufacturing a crystalline silicon ingot is also provided.

The invention provides a container for silicon ingot fabrication. The container includes a base layer and a barrier layer over an inner surface of the base layer. The base layer includes quartz. The barrier layer and the base layer are bonded together by atomic bonding to render an adhesion force between the barrier layer and the base layer. The barrier layer includes silicon oxynitride represented by $Si_xN_yO_z$, $1 \leq x \leq 2$, $1 \leq y \leq 2$, and $0.1 \leq z \leq 1$.

The invention provides a method for manufacturing a container for silicon ingot fabrication. The method includes the following steps. A base layer made of quartz is provided in a chamber. A powder solution layer is coated over an inner surface of the base layer. The powder solution layer includes silicon nitride ($Si_3N_4$), carbon, or silicon. The base layer having the powder solution layer coated thereon is heated to a temperature of 1000° C. to 1700° C. while a reaction gas is supplied into the chamber for 2 hours to 8 hours to make a part of the base layer form a barrier layer.

The invention provides a method for manufacturing a crystalline silicon ingot. The method includes the following steps. A silicon material is placed in a container. The container has a base layer and a barrier layer over an inner surface of the base layer. The base layer includes quartz. The barrier layer and the base layer are bonded together by atomic bonding to render an adhesion force between the barrier layer and the base layer. The barrier layer includes silicon oxynitride represented by $Si_xN_yO_z$, $1 \leq x \leq 2$, $1 \leq y \leq 2$, and $0.1 \leq z \leq 1$. Subsequently, the silicon material is heated and melted to form a silicon melt. The silicon melt is solidified to form a crystalline silicon ingot.

Accordingly, by forming a barrier layer over an inner surface of the base layer, the atoms in the container is less likely to diffuse into crystalline silicon ingot formed subsequently. In other words, the barrier layer inhibits the diffusion of impurities originated from the container, so as to reduce the amount of impurities in the crystalline silicon ingot. As such, the quality of the crystalline silicon ingot may be improved, and the efficiency of solar cell fabricated using the said crystalline silicon ingot may also be enhanced.

To make the above and other features and advantages of the invention more comprehensible, embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
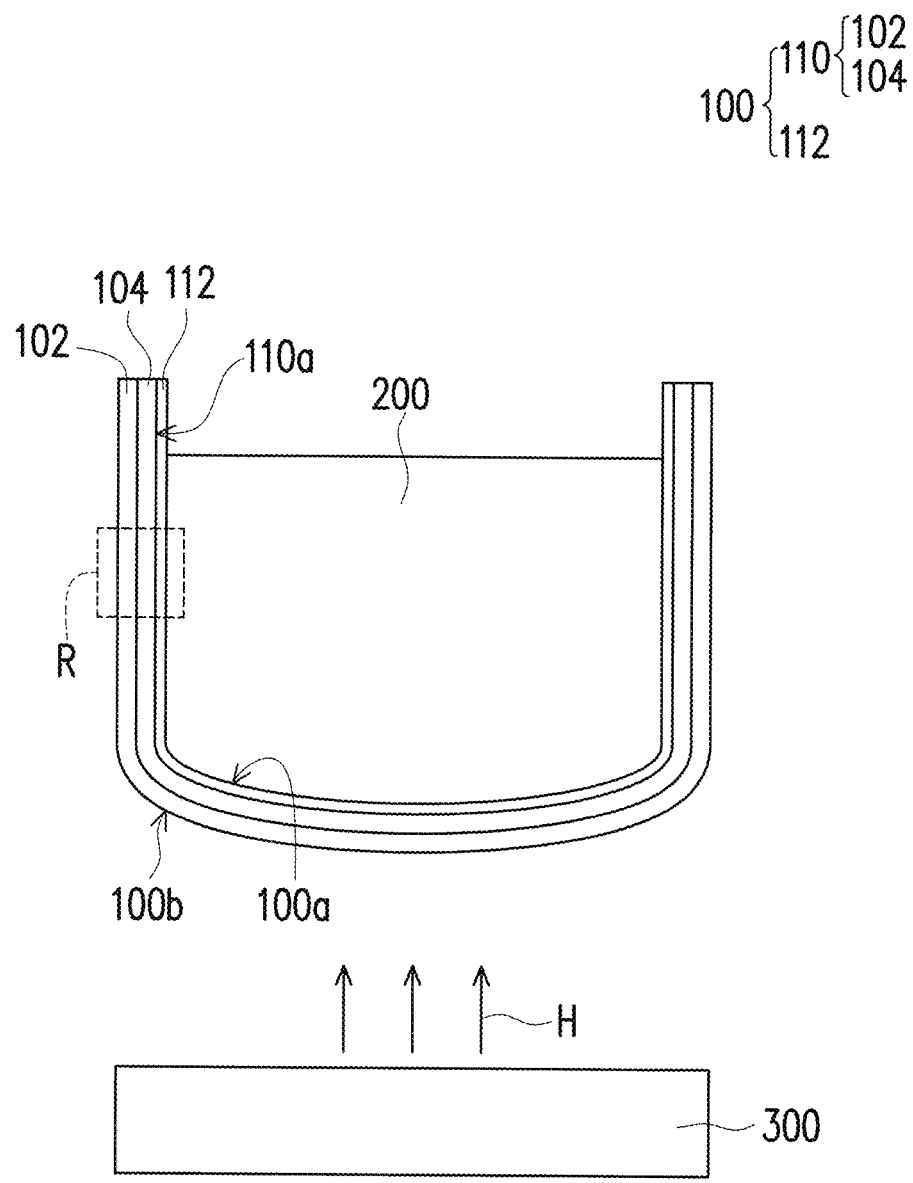
FIG. 1 is a schematic view illustrating a crystalline silicon ingot growth system according to an embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1 is a schematic view illustrating a crystalline silicon ingot growth system according to an embodiment of the invention. Referring to FIG. 1, the crystalline silicon ingot growth system includes a container 100, a crystalline silicon ingot 200, and a heat source 300. The container 100 includes an inner surface 100a and an outer surface 100b. The crystalline silicon ingot 200 is contained in the container 100 and is formed over the inner surface 100a of the container 100. The heat source 300 is separated from the container 100 by a distance and provides thermal radiation (thermal energy) H toward the container 100. The heat source 300 is, for example, a graphite heater. The crystalline silicon ingot 200 may be formed by the following steps. First, a silicon material (not illustrated) is placed in the container 100. Subsequently, through thermal radiation H provided by the heat source 300, the silicon material contained in the container 100 is heated and melted to form a silicon melt. Thereafter, the silicon melt is solidified to form the crystalline silicon ingot 200. In some embodiments, steps of forming the crystalline silicon ingot 200 include rotating the container 100 and the crystalline silicon ingot 200 with different directions, so that the crystalline silicon ingot 200 and the container 100 are separated from each other. For example, the container 100 may rotate in a clockwise direction, while the crystalline silicon ingot 200 may rotate in a counter-clockwise direction.

The container 100 is, for example, a crucible for silicon ingot growth. The container 100 includes a base layer 110 and a barrier layer 112. The base layer 110 may be made of quartz. In some embodiments, the base layer 110 is made of pure silicon dioxide ($SiO_2$), but it construes no limitation in the invention. In some alternative embodiments, the base layer 110 may include molecules other than $SiO_2$. For example, the base layer 110 may also include silicon carbide (SiC) or silicon nitride (SiN). The base layer 110 includes a bubble composite layer 102 and a bubble free layer 104. The bubble composite layer 102 is closer to the heat source 300 while the bubble free layer 104 is closer to the crystalline silicon ingot 200. In other words, the bubble free layer 104 is located between the bubble composite layer 102 and the crystalline silicon ingot 200 (or the barrier layer 112). The bubble composite layer 102 encompasses a plurality of bubbles (not illustrated) while the bubble free layer 104 is substantially a solid structure without bubbles formed therein. In alternative embodiments, the bubble free layer 104 still encompasses few bubbles (not illustrated). That is, a density of bubbles of the bubble free layer 104 is less than a density of bubbles of the bubble composite layer 102. The bubbles of the bubble composite layer 102 may scatter the thermal radiation H provided by the heat source 300. In other words, the bubbles in the bubble composite layer 102 aid the thermal radiation H to travel in all directions to achieve uniform heating. Therefore, uniform growth of the crystalline silicon ingot 200 may be attained. On the other hand, upon heating, the base layer 110 closer to the crystalline silicon ingot 200 may melt. In order to strengthen the base layer 110, the bubble free layer 104 is formed on a side closer to the crystalline silicon ingot 200. Since the bubble free layer 104 has a higher density, the durability and heat resistance of the base layer 110 may be enhanced, thereby extending the lifetime of the container 100.

The base layer 110 has an inner surface 110a which faces toward the crystalline silicon ingot 200. The barrier layer 112 is formed over an inner surface 110a of the base layer 110. In other words, the barrier layer 112 is sandwiched between the base layer 110 and the crystalline silicon ingot 200. The barrier layer 112 is substantially made of silicon oxynitride represented by $Si_xN_yO_z$, in which $1 \le x \le 2$, $1 \le y \le 2$, and $0.1 \le z \le 1$. Since the barrier layer 112 is made of silicon oxynitride and the base layer 110 is made of silicon dioxide, a matching between the lattices of these two layers may be observed. In other words, the barrier layer 112 and the base layer 110 are bonded together by atomic bonding to render a strong adhesion force between the barrier layer 112 and the base layer 110. The strong adhesion force between the barrier layer 112 and the base layer 110 may prevent parts of the barrier layer 112 from peeling due to a shear stress of relative rotation between the container 100 and the crystalline silicon ingot 200. In some embodiments, the adhesion force between the barrier layer 112 and the base layer 110 may be larger than 30 MPa. For example, the adhesion force between the barrier layer 112 and the base layer 110 may range between 50 MPa and 60 MPa. On the other hand, since the barrier layer 112 is formed by sintering and crystallization process, the thickness thereof may be relatively thin. For example, the barrier layer 112 may have a thickness of 20 μm to 150 μm. In some embodiments, the barrier layer 112 is preferable to have a thickness of 60 μm to 100 μm. Moreover, the barrier layer 112 has a roughened surface in which elliptic-like grain surface morphology may be observed, and a grain size may fall in the range of 15 μm to 55 μm. For example, in some embodiments, the grain size of the roughened surface of the barrier layer 112 may fall in the range of 28 μm to 43 μm. The barrier layer 112 is able to prevent diffusion of impurities (for example, oxygen atoms) from the base layer 110 into the crystalline silicon ingot 200. Thus, the quality of the crystalline silicon ingot 200 obtained may be improved. The crystalline silicon ingot 200 obtained may be diced to form a plurality of crystalline silicon wafers. The crystalline silicon wafers are subsequently used to manufacture electronic devices. Therefore, the performance of the devices manufactured by utilizing the crystalline silicon ingot 200 may be enhanced as well. The method of forming the barrier layer 112 will be described in detail below.

Figure 2A:
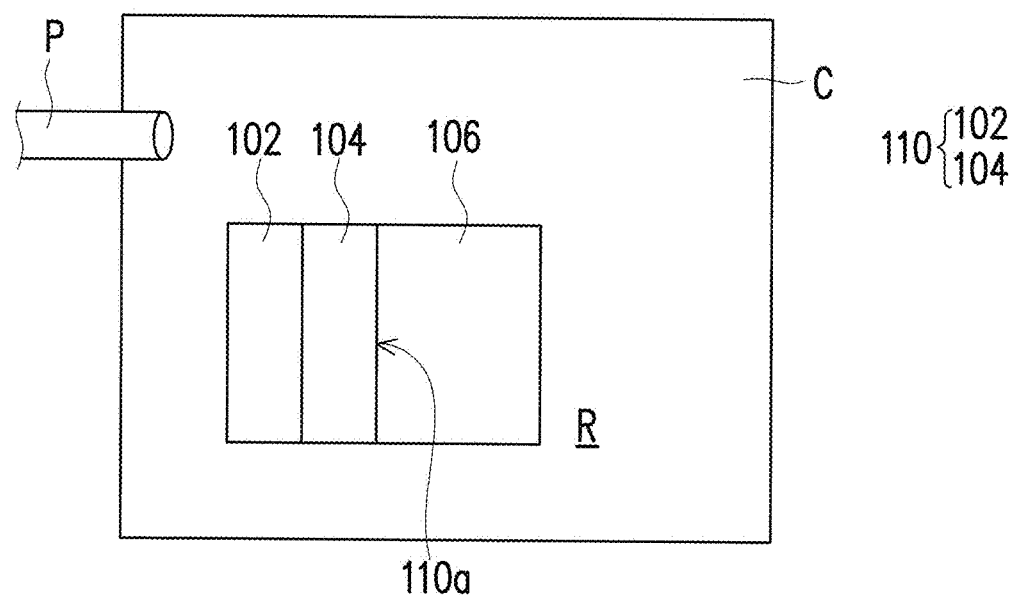
FIG. 2A to FIG. 2D are enlarged views of the container in region R of FIG. 1 illustrating manufacturing steps of the container according to an embodiment of the invention.

FIG. 2A to FIG. 2D are enlarged views of the container in region R of FIG. 1 illustrating manufacturing steps of the container 100 according to an embodiment of the invention. Referring to FIG. 2A, the base layer 110 is provided in a chamber C. The chamber C includes a pipe P for supplying a reaction gas in the subsequent processes. In the present embodiment, the base layer 110 is made of quartz ($SiO_2$) and includes the bubble composite layer 102 and the bubble free layer 104. In the present embodiment, a thickness of the bubble composite layer 102 is substantially equal to a thickness of the bubble free layer 104. However, it construes no limitation in the invention. In some alternative embodiments, the thickness of the bubble free layer 104 may be smaller than the thickness of the bubble composite layer 102. A powder solution layer 106 is coated over the inner surface 110a of the base layer 110 under atmospheric condition (760 torr and 100° C.). The powder solution for the powder solution layer 106 may be prepared by, for example, dissolving powders into a solvent. In the present embodiment, the powder includes silicon nitride ($Si_3N_4$) particles. On the other hand, the solvent may include distilled water, ethanol, or methanol. In addition, dispersant or binder with low segregation coefficient may be included. The base layer 110 having the powder solution layer 106 coated thereon is allowed to stand for 30 minutes.

Figure 2B:
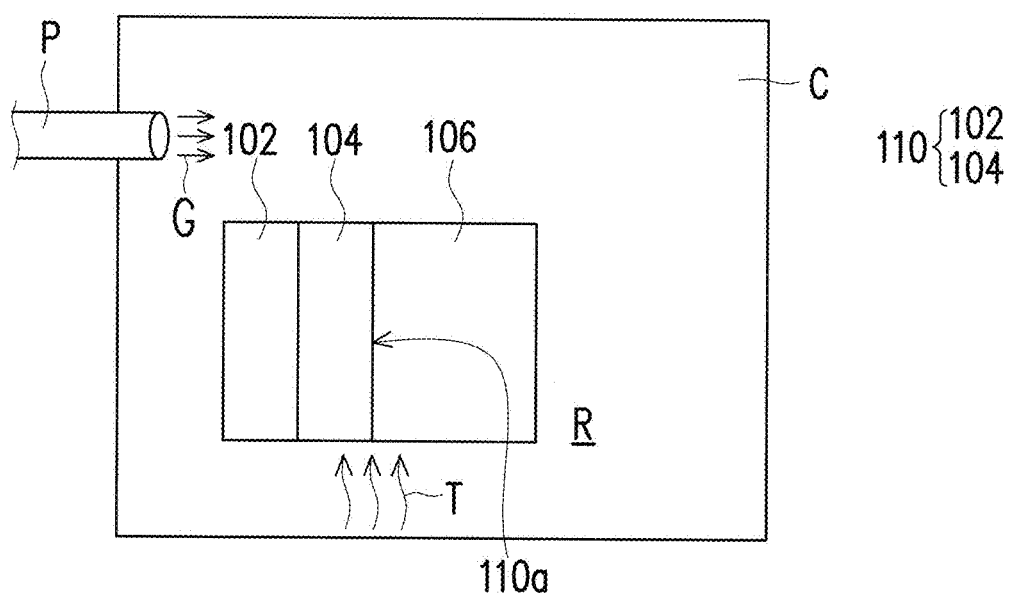
Figure 2C:
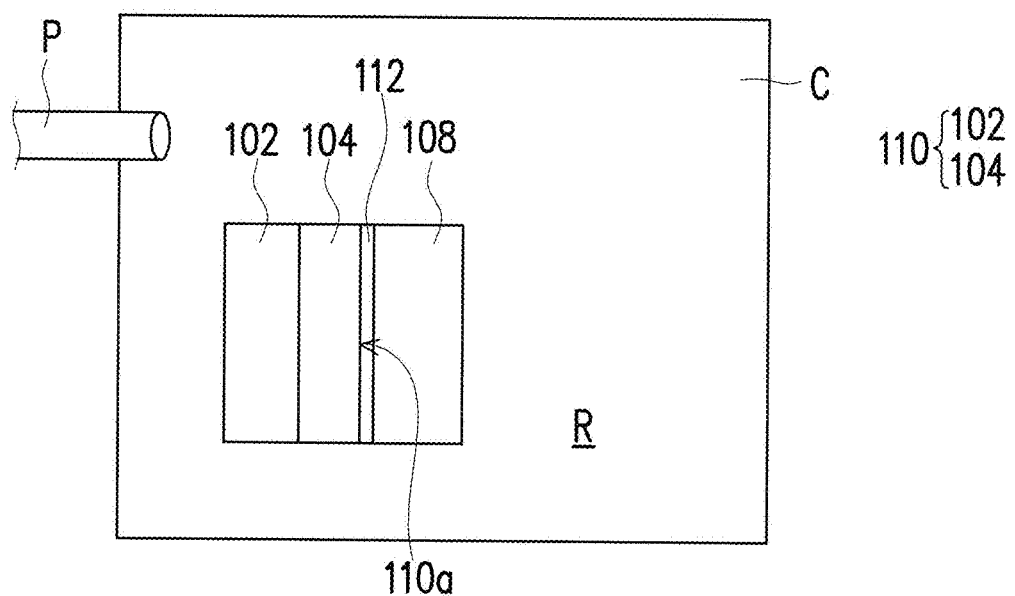

Referring to FIG. 2B, thermal energy T is provided to the chamber C. Specifically, the chamber C is heated to a temperature of 1000° C. to 1700° C. In a preferred embodiment, the chamber C is heated to a temperature of 1400° C. to 1600° C. Meanwhile, a reaction gas G is supplied into the chamber C through the pipe P. The reaction gas G is, for example, nitrogen gas. The chamber C is kept at a pressure ranges from 20 torr to 200 torr and the base layer 110 is allowed to react with the powder solution for 2 hours to 8 hours. Furthermore, it is preferred in another embodiment that the chamber C is kept at a pressure ranges from 50 torr to 100 torr with a reaction time of 4 hours to 6 hours. Since the reaction between the base layer 110 and the powder solution occurs in a nitrogen rich environment (high concentration of nitrogen gas), an interdiffusion between the oxygen atoms in the base layer 110 and the nitrogen atoms originated from the powder solution layer 106 and the reaction gas G may take place to form the barrier layer 112 over the inner surface 110a of the base layer 110, as illustrated in FIG. 2C. The barrier layer 112 is substantially constituted by silicon oxynitride. In some embodiments, the barrier layer 112 includes pure silicon oxynitride. In some alternative embodiments, slight amount of minor compounds such as silicon nitride and silicon oxide in addition to silicon oxynitride may be formed in the barrier layer 112. Usually, silicon nitride may be found in the barrier layer 112. The molecular formula of the silicon oxynitride in the barrier layer 112 may be presented by $Si_xN_yO_z$, in which $1 \leq x \leq 2$, $1 \leq y \leq 2$, and $0.1 \leq z \leq 1$. Since the barrier layer 112 is formed by sintering and interdiffusion, the barrier layer 112 and the base layer 110 are bonded together by atomic bonding to render a strong adhesion force between the barrier layer 112 and the base layer 110. For example, the adhesion force between the barrier layer 112 and the base layer 110 may be larger than 30 MPa. In some embodiments, the adhesion force between the barrier layer 112 and the base layer 110 may range between 50 MPa and 60 MPa. Moreover, the thickness of the barrier layer 112 may be relatively thin, in which the thickness thereof may fall in the range of 20 μm to 150 μm, and more preferably in the range of 60 μm to 100 μm. Furthermore, since the barrier layer 112 is formed by crystal growth, the barrier layer 112 has a roughened surface in which elliptic-like surface morphology may be observed, and the grain size may fall in the range of 15 μm to 55 μm. In other words, crystal particles or crystal grains may be found on the surface of the barrier layer 112. In some embodiments, it is possible to control the orientation of the crystal particles or crystal grains on the surface of the barrier layer 112 by adjusting reaction parameters. For example, the orientation of the crystals on the surface of the barrier layer 112 in x, y, and z directions may be controlled to obtain specific surface properties. As mentioned above, in the present embodiment, before growth of the barrier layer 112, the thickness of the bubble composite layer 102 is substantially equal to the thickness of the bubble free layer 104. However, it should be noted that since the bubble free layer 104 and the powder solution layer 106 both contribute to the reaction of forming the barrier layer 112, the thickness of these two layer are slightly reduced after the barrier layer 112 is formed, as illustrated in FIG. 2C. In other words, part of the bubble free layer 104 becomes the barrier layer 112, causing the reacted bubble free layer 104 to have a smaller thickness as compared to the unreacted bubble composite layer 102. Moreover, the thermal energy T provided to the chamber C is able to evaporate the solvent in the powder solution layer 106, so as to form a residual layer 108 which includes the remaining unreacted residues of $Si_3N_4$ particles. The unreacted residues of $Si_3N_4$ may take the form of powders.

Figure 2D:
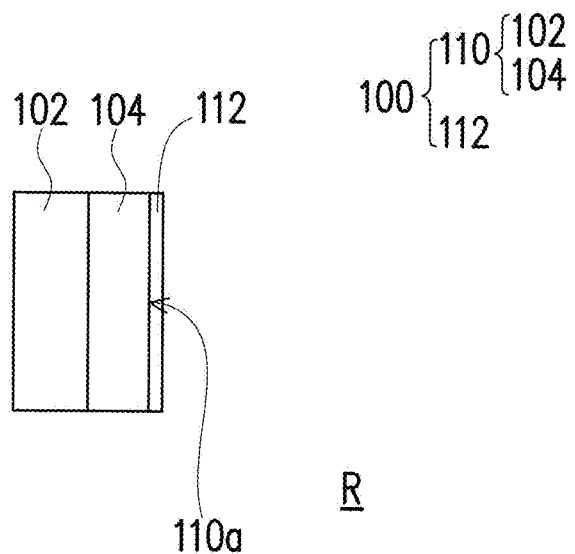

Referring to FIG. 2D, after the barrier layer 112 is formed, the residual layer 108 is removed. Since the unreacted residues of $Si_3N_4$ is in the form of powders, the residual layer 108 may be removed by scraping or air blowing.

Figure 3A:
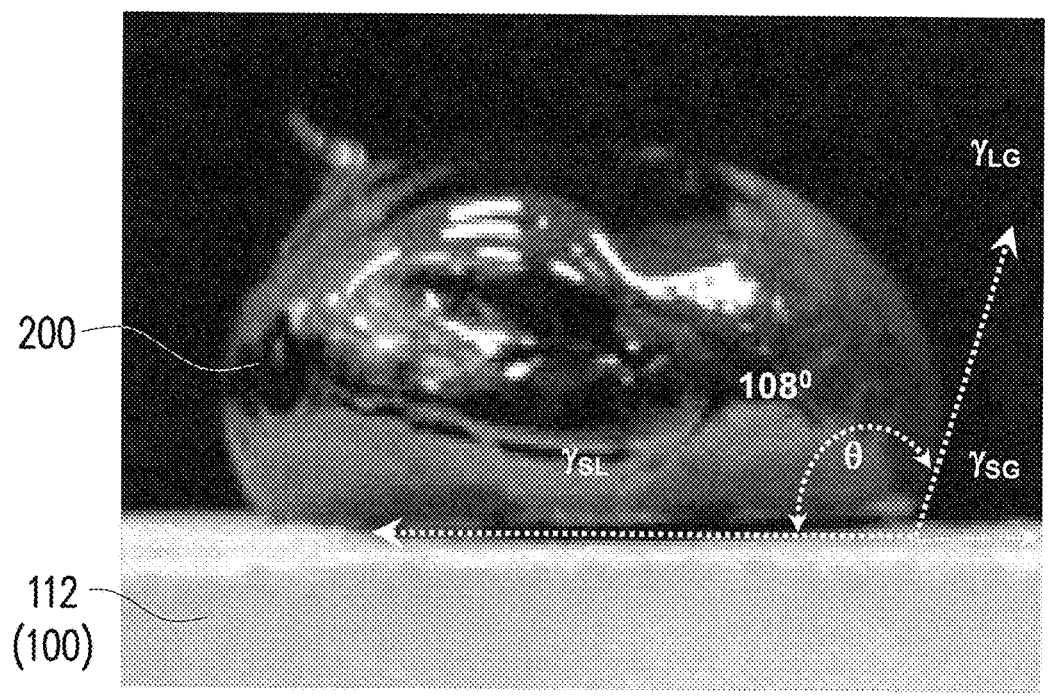
FIG. 3A is an Optical Microscope photomicrograph of an interface between a crystalline silicon ingot and the container manufactured according to FIG. 2A to FIG. 2D.
Figure 3B:
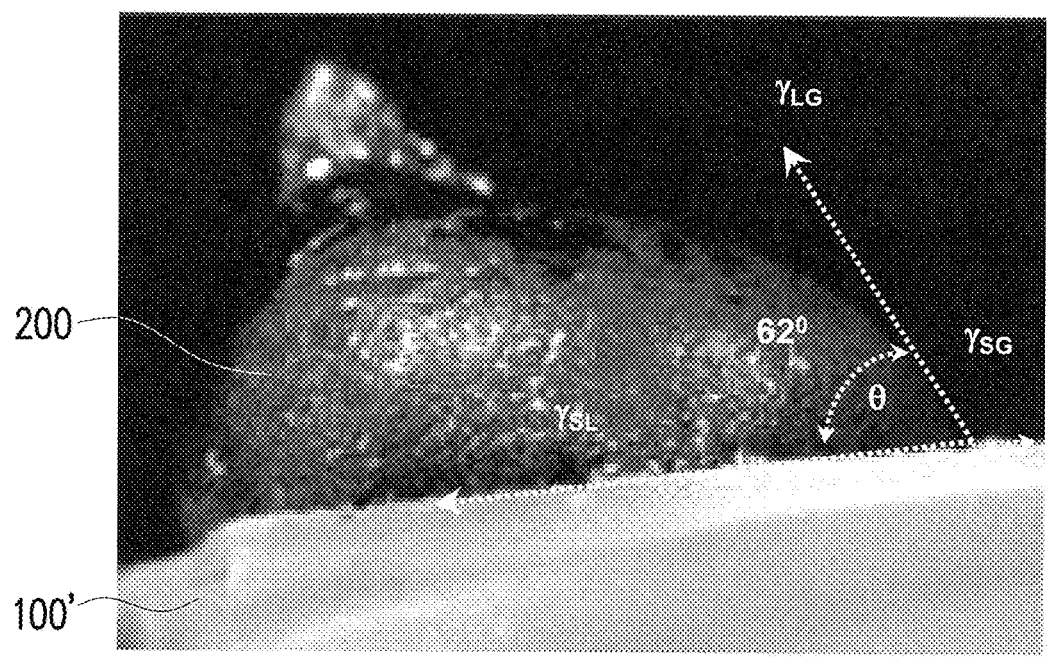
FIG. 3B is an Optical Microscope photomicrograph of an interface between a crystalline silicon ingot and a conventionally container without a barrier layer.

FIG. 3A is an Optical Microscope photomicrograph of an interface between the crystalline silicon ingot 200 and the container 100 manufactured according to FIG. 2A to FIG. 2D. FIG. 3B is an Optical Microscope photomicrograph of an interface between a crystalline silicon ingot 200 and a conventionally container 100' without a barrier layer. Referring to FIG. 3A and FIG. 3B, a wetting test is performed on the interface between the crystalline silicon ingot 200 and the containers 100, 100'. The contact angle θ between the crystalline silicon ingot 200 and the containers 100, 100' may be calculated by Young-Dupre Equation:

$$\gamma_{SG} = \gamma_{SL} + \gamma_{LG} \cos \theta$$

wherein $\gamma_{SG}$, $\gamma_{SL}$, and $\gamma_{LG}$ are surface tensions. As illustrated in FIG. 3A and FIG. 3B, the crystalline silicon ingot 200 in FIG. 3A has a contact angle θ of 108° with the barrier layer 112 while the crystalline silicon ingot 200 in FIG. 3B has a contact angle θ of 62° with the container 100'. In other words, the barrier layer 112 is able to prevent interaction between the crystalline silicon ingot 200 and the container 100. Furthermore, the interstitial oxygen content in the crystalline silicon ingot 200 close to the interface between the crystalline silicon ingot 200 and the containers 100, 100' has been measured by Fourier transform infrared spectroscopy (FTIR). In the embodiment of FIG. 3A, the interstitial oxygen content is approximately 12.35 parts-per-million-atomic (ppma). On the contrary, the interstitial oxygen content in FIG. 3B is approximately 19.73 ppma. From these experimental values, it is further confirmed that the barrier layer 112 may effectively prevent diffusion of impurities (for example, oxygen atoms) from the base layer 110 into the crystalline silicon ingot 200.

FIG. 4A to FIG. 4D are enlarged views of the container in region R of FIG. 1 illustrating manufacturing steps of the container according to another embodiment of the invention. Referring to FIG. 4A to FIG. 4D, the present embodiment is similar to the embodiment of FIG. 2A to FIG. 2D, and the difference lies in that in the present embodiment, the powder of the powder solution layer 106 may be carbon. In the present embodiment, the carbon atoms serve as catalysts for silicon reduction. In detail, the carbon atoms in the powder solution layer 106 aids the silicon dioxide of the base layer 110 to undergo carbothermal reduction to render free silicon atoms. In the other embodiments, the powder of the powder solution layer 106 may be pure silicon. The silicon powder of the powder solution layer 106 also renders free silicon atoms for following steps. Subsequently, the free silicon atoms may react with nitrogen gas (reaction gas G) supplied by the pipe P and the oxygen atom in the base layer 110 to form the barrier layer 112 over the inner surface 110a of the base layer 110. In other words, part of the base layer 110 becomes the barrier layer 112. It should be noted that the reaction parameters of the present embodiment may be the same as the reaction parameters in the embodiment of FIG. 2A to FIG. 2D.

Figure 4A:
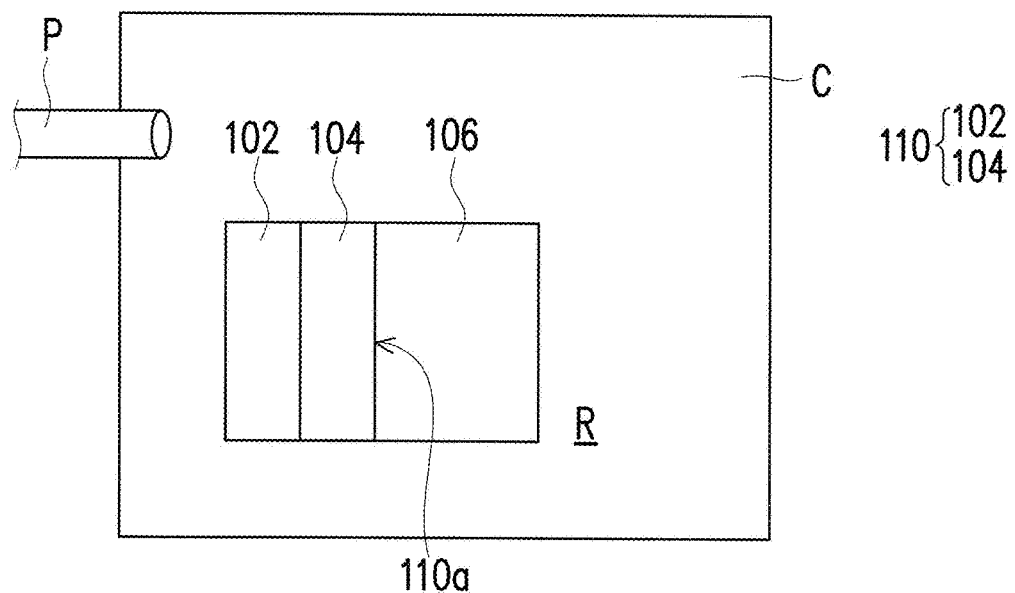
FIG. 4A to FIG. 4D are enlarged views of the container in region R of FIG. 1 illustrating manufacturing steps of the container according to another embodiment of the invention.
Figure 4B:
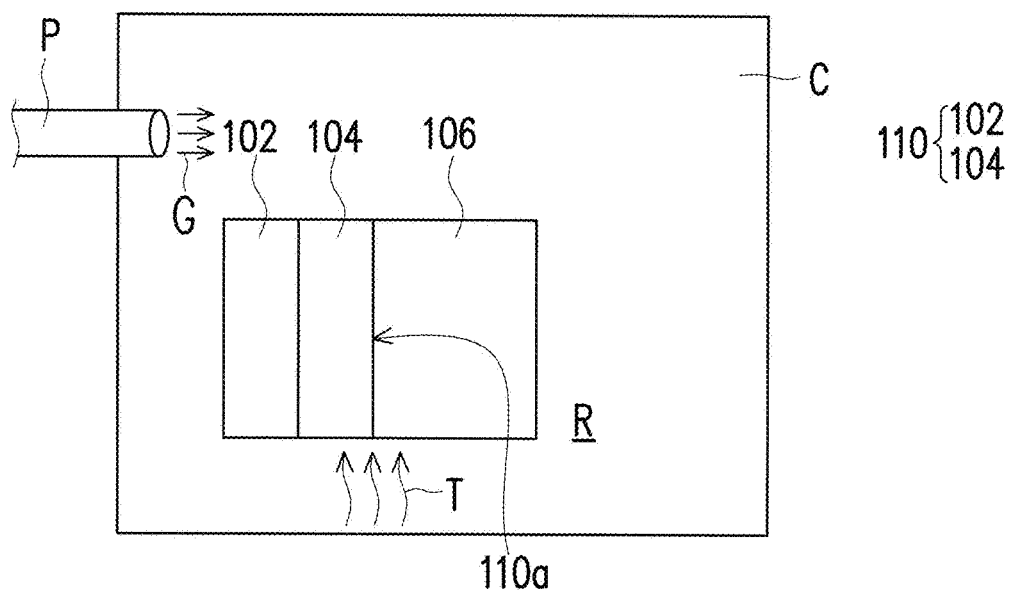
Figure 4C:
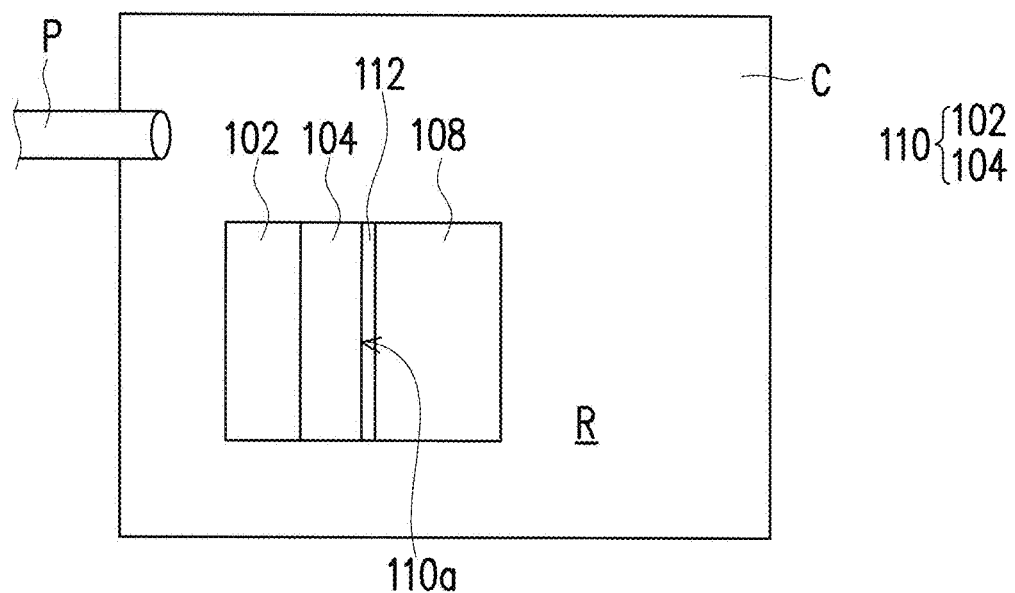
Figure 4D:
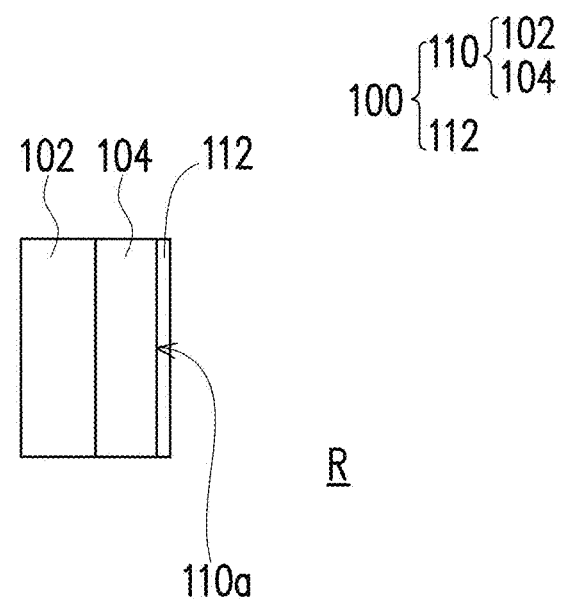

Similar to the embodiment of FIG. 2A to FIG. 2D, the molecular formula of the silicon oxynitride in the barrier layer 112 may be presented by $Si_xN_yO_z$, in which $1 \leq x \leq 2$, $1 \leq y \leq 2$, and $0.1 \leq z \leq 1$. Since the barrier layer 112 is formed by sintering and crystal growth, the barrier layer 112 and the base layer 110 are bonded together by atomic bonding to render a strong adhesion force between the barrier layer 112 and the base layer 110. For example, the adhesion force between the barrier layer 112 and the base layer 110 may be larger than 30 MPa. In some embodiments, the adhesion force between the barrier layer 112 and the base layer 110 may range between 50 MPa and 60 MPa. Moreover, the thickness of the barrier layer 112 may be relatively thin, in which the thickness thereof may fall in the range of 20 μm to 150 μm, and more preferably in the range of 60 μm to 100 μm. Furthermore, since the barrier layer 112 is formed by crystal growth, the barrier layer 112 has a roughened surface in which elliptic-like surface morphology may be observed, and the grain size may fall in the range of 15 μm to 55 μm. In other words, crystal particles or crystal grains may be found on the surface of the barrier layer 112. It should be noted that since the bubble free layer 104 contribute to the reaction of forming the barrier layer 112, the thickness of the bubble free layer 104 is slightly reduced after the barrier layer 112 is formed, as illustrated in FIG. 4C. On the other hand, the carbon atoms in the powder solution layer 106 merely serve as a catalyst, so the thickness loss in powder solution layer 106 is only derived from evaporation of the solvent.

Figure 5A:
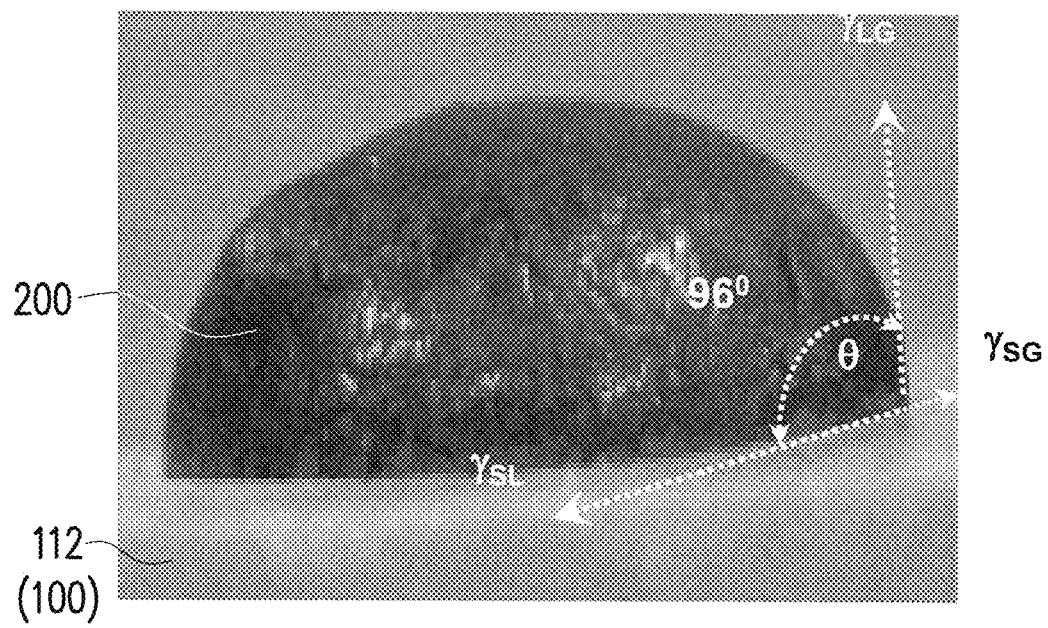
FIG. 5A is an Optical Microscope photomicrograph of an interface between a crystalline silicon ingot and the container manufactured according to FIG. 4A to FIG. 4D.
Figure 5B:
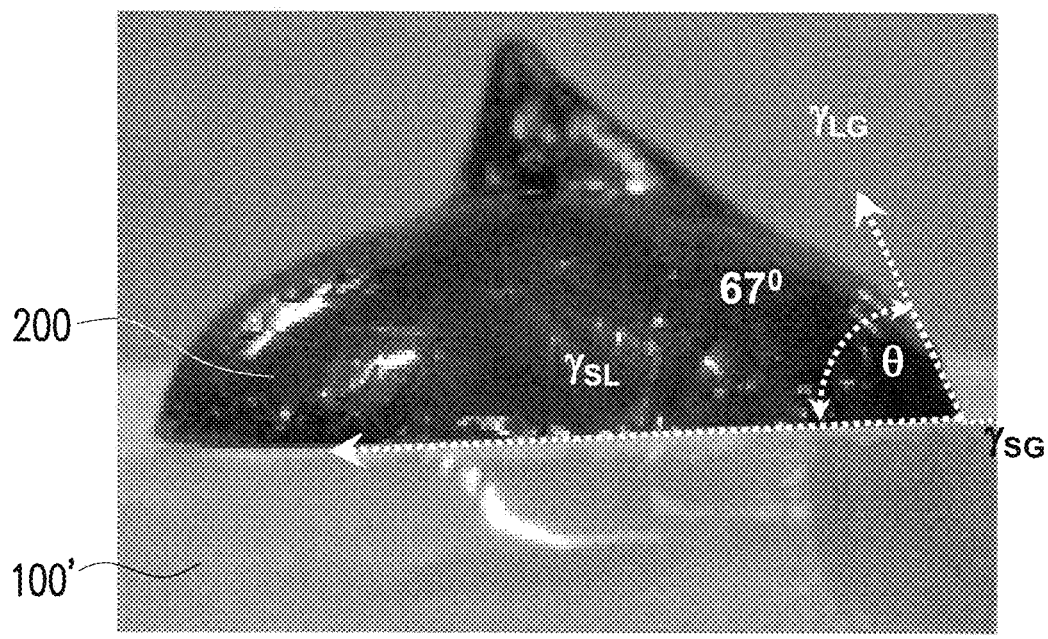
FIG. 5B is an Optical Microscope photomicrograph of an interface between a crystalline silicon ingot and a conventionally container without a barrier layer.

FIG. 5A is an Optical Microscope photomicrograph of an interface between a crystalline silicon ingot 200 and the container 100 manufactured according to FIG. 4A to FIG. 4D. FIG. 5B is an Optical Microscope photomicrograph of an interface between a crystalline silicon ingot 200 and a conventionally container 100' without a barrier layer. Similar to that of FIG. 3A and FIG. 3B, a wetting test is performed on the interface between the crystalline silicon ingot 200 and the containers 100, 100' in FIG. 5A and FIG. 5B. As illustrated in FIG. 5A and FIG. 5B, the crystalline silicon ingot 200 in FIG. 5A has a contact angle θ of 96° with the barrier layer 112 while the crystalline silicon ingot 200 in FIG. 5B has a contact angle θ of 67° with the container 100'. In other words, the barrier layer 112 is able to prevent interaction between the crystalline silicon ingot 200 and the container 100. Furthermore, the average oxygen content in the crystalline silicon ingot 200 close to the interface between the crystalline silicon ingot 200 and the containers 100, 100' has been measured by Inert Gas Fusion Analysis (IGFA). In the embodiment of FIG. 5A, the average oxygen content is approximately 15 parts-per-million-weight (ppmw). On the contrary, the average oxygen content in FIG. 5B is approximately 22 ppmw. From these experimental values, it is further confirmed that the barrier layer 112 may effectively prevent diffusion of impurities (for example, oxygen atoms) from the base layer 110 into the crystalline silicon ingot 200.

As mentioned above, the barrier layer 112 is formed by crystal growth in embodiments of the invention. Therefore, the barrier layer 112 of the invention would exhibit different properties from a silicon oxynitride layer formed over the base layer 110 through coating techniques. A comparison among the barrier layer 112 of the invention formed by crystal growth, the silicon oxynitride layer formed through coating techniques (Comparative Example 1), and the silicon oxynitride layer formed through coating techniques with sintering (Comparative Example 2) is illustrated in Table 1 below.

In Comparative Example 1, the silicon oxynitride powders (powder particle average size is 5 μm) were dissolved in a solvent (e.g., distilled water) to form a silicon oxynitride solution, the silicon oxynitride solution was then coated on a quartz substrate with a dimension of 50 mm×50 mm×10 mm. In Comparative Example 2, the quartz substrate having the silicon oxynitride layer coated thereon of Comparative Example 1 was provided. The quartz substrate having the silicon oxynitride layer coated thereon is heated to a temperature of 1500° C.

TABLE 1

| Item | Embodiments of the Invention | Comparative Example 1 | Comparative Example 2 |
|---|---|---|---|
| Formation method of the silicon oxynitride layer | Crystal growth | Coating | Coating with sintering |
| Surface Morphology (μm) | 28 μm-43 μm (grain size average diameter) | 5 μm (powder particle average size) | Crack-like |
| Thickness (m) | 70 μm | 500 μm | N/A |
| Adhesion Test | Residues are still found | Residues are all removed | Residues are all removed |
| Adhesion Force | 50 MPa to 60 MPa (Calculated based on ultrasonicator powder and frequency) | N/A | N/A |

The adhesion test is performed by immersing a sample with a dimension of 50 mm×50 mm×10 mm into an ultrasonicator bath filled with distilled water. The distilled water in the ultrasonicator bath has a temperature of 25° C. Subsequently, the ultrasonicator bath is turned on, and a power of 400 W is provided to vibrate the ultrasonicator bath at a frequency of 40 kHz for 15 minutes. The surface of the sample is inspected.

As clearly demonstrated in Table 1, the grain size of the particles over the surface of the barrier layer 112 is larger than that of the silicon oxynitride layer formed through coating. In other words, the barrier layer 112 of the invention has a rougher surface morphology. On the other hand, the thickness of the barrier layer 112 formed by crystal grown in embodiments of the invention is significantly thinner than the silicon oxynitride layer in the Comparative Example 1. Furthermore, after the adhesion test, residues can still be found over the barrier layer 112 of the invention while all the residues in the Comparative Example 1 are being removed. By the way, the silicon oxynitride layer in the Comparative Example 2 is crack or crack-like after sintering. Therefore, the all the residues in the Comparative Example 2 are being removed after the adhesion test. In other words, the adhesion between the barrier layer 112 and the base layer 110 in embodiments of the invention is significantly stronger than the adhesion between the silicon oxynitride layer formed by coating techniques and the base layer 110.

It should be noted that the crack of the silicon oxynitride layer of the Comparative Example 2 is observed after sintering due to the mismatch in coefficients of thermal expansion between the silicon oxynitride layer and the quartz substrate. In practical, the residues of the silicon oxynitride layer in the Comparative Examples 1 and 2 will pollute a silicon ingot Mimed subsequently, so as to increase the amount of impurities in the silicon ingot.

Figure 6:
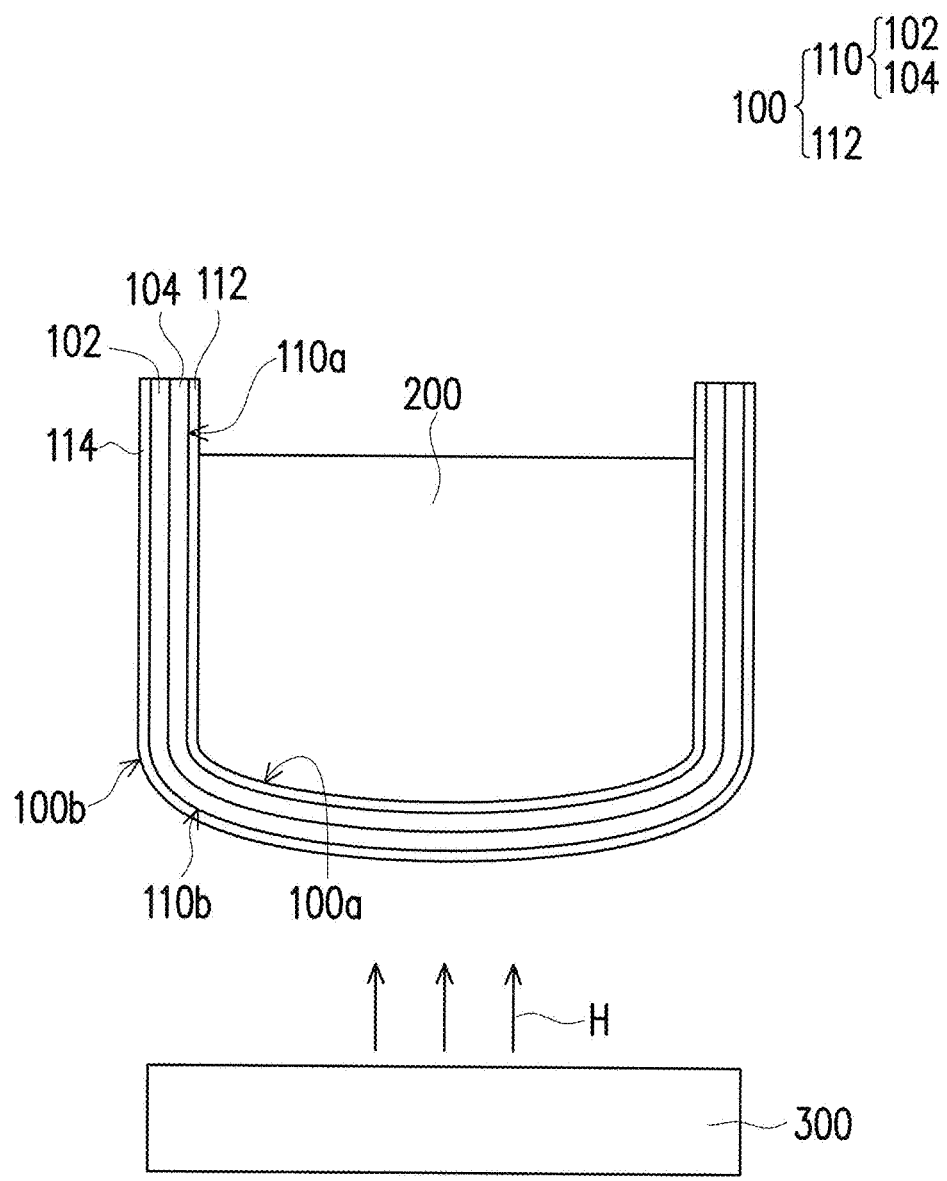
FIG. 6 is a schematic view illustrating a crystalline silicon ingot growth system according to another embodiment of the invention.

FIG. 6 is a schematic view illustrating a crystalline silicon ingot growth system according to another embodiment of the invention. Referring to FIG. 6, the present embodiment is similar to the embodiment of FIG. 1, and the difference lies in that in the present embodiment, the container 100 further includes a protection layer 114 formed over the outer surface 110b of the base layer 110. A material and a manufacturing method of the protection layer 114 may be identical to that of the barrier layer 112. In other words, the protection layer 114 is substantially constituted by silicon oxynitride. The molecular formula of the silicon oxynitride in the protection layer 114 may be presented by $Si_xN_yO_z$, in which $1 \le x \le 2$, $1 \le y \le 2$, and $0.1 \le z \le 1$. The protection layer 114 may be manufactured by the methods illustrated in FIG. 2A to FIG. 2D or FIG. 4A to FIG. 4D. As mentioned above, the heat source 300 may be a graphite heater. During the process of providing thermal radiation H, the impurities in the heat source 300 may be released. These impurities may contaminate the outer surface 100b of the container 100, causing crystallization and cracking of the container 100. Therefore, by forming the protection layer 114 over the outer surface 110b of the base layer 110, the interaction which causes cracking in the container 100 may be prevented. Therefore, the lifetime of the container 100 may be effectively extended.

To sum up, the barrier layer inhibits the diffusion of impurities originated from the container, so as to reduce the amount of impurities in the crystalline silicon ingot. As such, the quality of the crystalline silicon ingot may be improved, and the efficiency of solar cell fabricated using the said crystalline silicon ingot may also be enhanced. In addition, the adhesion force between the barrier layer and the base layer may prevent parts of the barrier layer from peeling due to a shear stress of relative rotation between the container and the crystalline silicon ingot. The quality of the crystalline silicon ingot may be further enhanced.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A container for silicon ingot fabrication, comprising: a base layer, wherein the base layer comprises quartz; a barrier layer over an inner surface of the base layer, wherein the barrier layer comprises silicon oxynitride represented by $SixN_yO_z$ $1 \leq x \leq 2$, $1 \leq y \leq 2$, and $0.1 \leq z \leq 1$, wherein the base layer comprises a bubble composite layer and a bubble free layer, the bubble free layer is between the bubble composite layer and the barrier layer, and the barrier layer is formed by reacting a powder solution layer with the bubble free layer, such that a part of the bubble free layer becomes the barrier layer, the powder solution layer comprises silicon nitride ($Si_3N_4$), carbon, or silicon.

2. The container of claim 1, wherein the barrier layer has a thickness of 20 μm to 150 μm.

3. The container of claim 1, wherein the barrier layer comprises silicon nitride.

4. The container of claim 1, wherein the adhesion force between the barrier layer and the base layer is larger than 30 MPa.

5. The container of claim 1, wherein the barrier layer has a roughened surface and a grain size of the barrier layer falls in the range of 15 μm to 55 μm.

6. A method for manufacturing a container of claim 1 for silicon ingot fabrication, comprising: providing a base layer made of quartz in a chamber, wherein the base layer comprises a bubble composite layer and a bubble free layer, the bubble free layer is disposed inside; coating a powder solution layer over an inner surface of the bubble free layer, wherein the powder solution layer comprises silicon nitride ($Si_3N_4$), carbon, or silicon; heating the base layer having the powder solution layer coated thereon to a temperature of 1000° C. to 1700° C. while supplying a reaction gas into the chamber for 2 hours to 8 hours, so that a part of the base layer is reacted to form a barrier layer such that a part of the bubble free layer becomes the barrier layer, the barrier layer comprises silicon oxynitride represented by $SixN_yO_z$ $1 \leq x \leq 2$, $1 \leq y \leq 2$, and $0.1 \leq z \leq 1$.

7. The method of claim 6, wherein the reaction gas comprises nitrogen gas.

8. The method of claim 7, wherein the barrier layer is formed by crystal growth.

9. The method of claim 7, wherein the barrier layer has a roughened surface and a grain size of the barrier layer falls in the range of 15 μm to 55 μm.

10. A method for manufacturing a crystalline silicon ingot, comprising: placing a silicon material in a container of claim 1, wherein the container has the base layer comprising quartz and the barrier layer over the inner surface of the base layer, wherein the barrier layer comprises silicon oxynitride represented by $SixN_yO_z$ $1 \leq x \leq 2$, $1 \leq y \leq 2$, and $0.1 \leq z \leq 1$, the base layer comprises the bubble composite layer and the bubble tree layer, the bubble free layer is between the bubble composite layer and the barrier layer, and the barrier layer is formed by reacting a powder solution layer with the bubble tree layer, such that a part at the bubble free layer becomes the barrier layer, the powder solution layer comprises silicon nitride ($Si_3N_4$), carbon, or silicon; heating and melting the silicon material to form a silicon melt; and solidifying the silicon melt to form a crystalline silicon ingot.

* * * * *